United States Patent [19]

Schutyser et al.

[11] Patent Number: 5,391,435
[45] Date of Patent: Feb. 21, 1995

[54] INTERPENETRATING NETWORK OF RING-CONTAINING ALLYL POLYMERS AND EPOXY RESIN LAMINATE

[75] Inventors: Jan A. J. Schutyser, JJ Dieren; Antonius J. W. Buser, DA Wehl; Pieter H. Zuuring, LW Nijmegen; Hendrik J. Slot, PV Rijssen, all of Netherlands

[73] Assignee: Akzo Nobel N.V., Arnhem, Netherlands

[21] Appl. No.: 987,226

[22] Filed: Dec. 8, 1992

Related U.S. Application Data

[62] Division of Ser. No. 563,571, Aug. 7, 1990, Pat. No. 5,210,157.

[30] Foreign Application Priority Data

Aug. 15, 1989 [NL] Netherlands ............... 8902066

[51] Int. Cl.$^6$ ............... B32B 15/08; C08L 39/04
[52] U.S. Cl. ............... 428/416; 428/418; 428/290; 428/522
[58] Field of Search ............ 428/416, 418, 288, 290, 428/522; 525/530, 486, 488, 529, 903, 502

[56] References Cited

U.S. PATENT DOCUMENTS

| 4,468,485 | 8/1984 | Gourdenne et al. | 523/137 |
| 4,604,317 | 8/1986 | Berman et al. | 428/285 |
| 4,661,568 | 4/1987 | Koenig et al. | 525/510 |
| 4,755,571 | 7/1988 | Iruing et al. | 525/530 |
| 4,957,981 | 9/1990 | Schutyser et al. | 525/903 |

FOREIGN PATENT DOCUMENTS

| 1564365 | 5/1968 | France . |
| 54-083998 | 7/1979 | Japan . |
| 54-483998 | 7/1979 | Japan . |
| 57-149317 | 9/1982 | Japan . |
| 5996115 | 11/1982 | Japan . |
| 61-13610 | 2/1985 | Japan . |
| 1223338 | 2/1971 | United Kingdom . |
| 5955355 | 3/1978 | U.S.S.R. . |
| 85/00610 | 2/1985 | WIPO | 525/530 |

*Primary Examiner*—P. C. Sluby
*Attorney, Agent, or Firm*—Louis A. Morris

[57] ABSTRACT

A polymeric material used in laminates with metal comprises an interpenetrating polymer network composed of a cyclic moiety-containing pollyallyl compound optionally with an aromatic difunctional compound (co)-polymerized and cross-linked in the presence of a free radical initiator, and an epoxy resin cross-linked with a polyhydric phenol.

13 Claims, No Drawings

INTERPENETRATING NETWORK OF RING-CONTAINING ALLYL POLYMERS AND EPOXY RESIN LAMINATE

This is a division of application Ser. No. 07/563,571, filed Aug. 7, 1990, now U.S. Pat. No. 5,210,157.

BACKGROUND OF THE INVENTION

1. Field of the Invention

The field of the instant invention relates to polymeric material, particularly as used in laminates with metal in the electronic industry.

2. Description of the Known Art

A polymeric material is known from U.S. Pat. No. 4,468,485. In this patent specification the polymer that can be cross-linked under the influence of radicals is an unsaturated polyester resin. The epoxy resin is of the DGEBA type (diglycidyl ether of Bisphenol-A) and is cross-linked using a polyfunctional amine. For the preparation of an interpenetrating network (IPN) without phase separation the above-mentioned patent specification describes a process in which use is made of microwave radiation of a frequency spectrum so chosen as to effect the cross-linking of the polyester, with the heat released in this process triggering the cross-linking reaction of the epoxy resin.

Admittedly, in this manner there is obtained a polymeric material which has one single glass transition temperature (Tg) (in the range of 50°–100° C. depending on the IPN's composition), but the process used is not universally applicable. Although said patent specification does teach the skilled man a process for the preparation of IPNs, it offers no teaching on how, by the proper selection of IPN components, suitable electronic materials can be manufactured.

It is generally known that there is a need to replace the present electronic materials with materials meeting requirements such as
  low dielectric constant
  low electrical dissipation factor
  high Tg
  ready processability
  low price
  high dimensional stability
  high solvent resistance
more satisfactorily.

The instant invention employs IPN technology to obtain materials especially suited to be used in the electronics industry.

SUMMARY OF THE INVENTION

The present invention is a polymeric material comprising an interpenetrating network (IPN) built up from a polymer that can be cross-linked in the presence of a free radical catalyst and an epoxy resin comprising a cross-linking agent. The polymer is built up from at least one cyclic moiety-containing polyallyl compound which may or may not be combined with an aromatic difunctional methacylate. The cross-linking agent for the epoxy resin is a polyhydric phenol or a cyclic carboxylic anhydride not containing a functional group polymerizable under the influence of radicals.

DETAILED DESCRIPTION OF THE INVENTION

The two IPN-forming polymer and epoxy resin are mixed in such a ratio as to give a resin of which the properties are no longer determined by one of the IPN constituents individually. Although this ratio is to some extent dependent on the type of allyl compound and the type of epoxy resin used, in general a weight ratio of 80/20 or 20/80 will be adhered to as a limit. Since both the allyl polymer and the epoxy resin provide a share of the favorable IPN properties, the preferred ratio is dependent on those properties which are especially envisaged. If it is desired to stress electrical or thermal properties, then a ratio of allyl polymer to epoxy resin of 70/30 –60/40 will be selected; if the manufacture is desired of a laminate with a metal layer (such as for printed circuits), then a ratio of allyl polymer to epoxy resin of 30/70 –40/60 will be chosen on account of the favorable peel strength. Preference is given to an IPN in which the properties of the two constituents come out optimally. This is the case for a ratio of allyl polymer to epoxy resin of 40/60 –60/40, more preferably 50/50.

It should be noted that the above-mentioned cross-linking agents for epoxy resin are known. However, what is novel and surprising is that from an epoxy resin to be cross-linked with the aforesaid materials and ring-containing allyl polymers an IPN is obtained with one glass transition temperature (Tg), since it is known from U.S. Pat. No. 4,468,485 already referred to above that, if the method described in that specification is not followed, in general IPN synthesis will give rise to structures with phase separation.

It should further be noted that in U.S. Pat. No. 4,604,317 and 4,661,568 (corresponding to WO 85/03515 and 86/02085, respectively) an epoxy resin is described which is used for the manufacture of electronic materials. The advantage to the IPNs according to the invention is that, compared with these electronic materials which are made up exclusively of epoxy resin, they are less expensive, have more favorable electrical properties, display a higher solvent resistance, and are fire retardant at a lower bromine content, which is beneficial to the environment.

The polymer that can be cross-linked in the presence of a free radical catalyst is built up from ring-containing polyallyl compounds. To prepare the polymer the allyl compounds may be employed either in the monomeric or the oligomeric (prepolymeric) form.

As suitable polyallyl compounds may be mentioned triallyl cyanurate (TAC), triallyl isocyanurate (TAIC), and aromatic polyallyl esters such as diallyl phthalate, diallyl isophthalate, diallyl terephthalate, triallyl trimellitate, tetrallyl pyromellitate, and diallyl tetrabromophthalate.

The structural formulae of TAC and TAIC are given below:

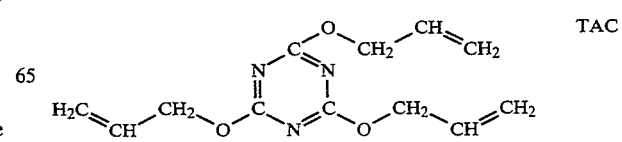

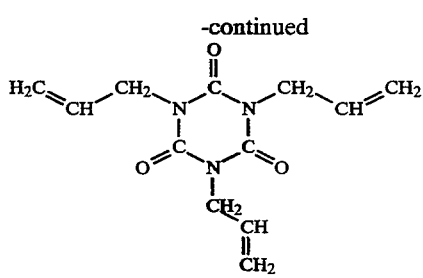 TAIC

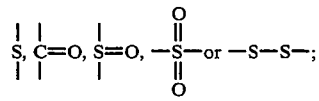

TAC and TAIC prepolymers can be prepared by the partial polymerization of TAC monomer or TAIC monomer in, say, methylethyl ketone (MEK) in the presence of a peroxide of a relatively low decomposition temperature, e.g. dibenzoyl peroxide or di(orthomethylbenzoyl) peroxide. The monomer conversion, the viscosity, and the molecular weight distribution of the TAC or TAIC oligomers can be controlled by means of the amount of peroxide employed and the reaction time. Optionally, use may be made in the polymerization process of a chain regulator such as carbon tetrabromide to prevent the prepolymerization resulting in gelling.

As is known to the skilled man, it is possible to remove monomers from TAC or TAIC prepolymers by selective precipitation, using a suitable organic solvent.

Aromatic polyallyl esters can be illustrated using the following general structural formula:

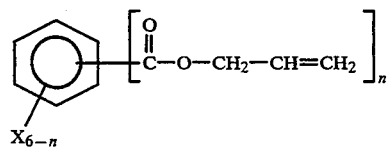

wherein n=2, 3 or 4 and each X individually represents hydrogen or halogen (especially bromine).

Of course, suitable ring-containing polyallyl compounds are not restricted to the above-indicated structural formulae.

Preferably, the polyallyl compound used is TAC (in the monomeric or prepolymeric form), since this will give an IPN with optimal thermal properties. Moreover, TAC has the advantage that it may also serve as a solvent in the IPN preparation; consequently, additional solvent may largely be omitted.

Aromatic difunctional methacrylates may be used to partially replace the polyallyl compounds in the IPN. Suitable methacrylates may be of the following structural formula:

$$S, C=O, S=O, -\overset{O}{\underset{O}{\overset{\|}{S}}}- \text{ or } -S-S-;$$

Preferably, use is made of 2,2-di(4-methacryloxyethoxyphenyl)propane (BMEPP).

The polymerization of the ring-containing polyallyl polyalkyl compounds is carried out under the influence of an initiator that will generally be employed in a ratio of 0.1–5 wt. %, calculated on the allyl compound. Examples of suitable initiators include peroxides, such as t-butylperoxy benzoate, t-butylperoxy-3,5,5-trimethyl hexanoate, and benzoyl peroxide.

By the term "epoxy resin" is meant a curable composition of oxirane ring-containing compounds. Such compounds have been described in C A. May's "Epoxy Resins", 2nd Edition, Marcel Dekker Inc., New York & Basle, 1988.

As examples of epoxy resins may be mentioned phenol types, such as those based on the diglycidyl ether of Bisphenol-A, on polyglycidyl ethers of phenol-formaldehyde Novolac or cresol-formaldehyde Novolac, on the triglycidyl ether of tris(p-hydroxyphenol)methane, or on the tetraglycidyl ether of tetraphenyl ethane; amine types, such as those based on tetraglycidyl methylene dianiline or on the triglycidyl ether of p-aminoglycol; and cycloaliphatic types, such as those based on 3,4-epoxycyclohexylmethyl-3,4-epoxycyclohexane carboxylate.

By the term "epoxy resin" are also meant reaction products of compounds (e.g. of the foregoing types) containing an excess of epoxy with aromatic dihydro compounds. These dihydro compounds may be halogen substituted. The same epoxy resins were described in WO 86/02085 referred to above.

Preference is given to epoxy resins of the phenol type, especially because of their low price.

It should be noted that, as a rule, one unequivocal structural formula is used to illustrate epoxy resins. Differing products resulting from side reactions which occur in the preparation of epoxy resins should, as the skilled man products form a standard constituent of cured epoxy resins, so they make up a standard constituent of the IPNs according to the invention.

It is of importance that the epoxy resin be so cured as to give a non-segregated IPN. Moreover, the curing method has its effect on the IPN's final material properties.

To obtain a non-segregated IPN of favorable properties the epoxy resin is cured using the types of cross-linking agent referred to above. As examples of poly-

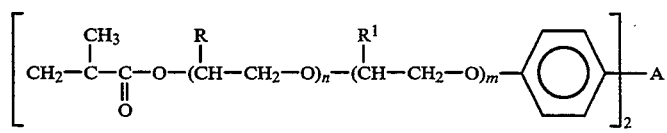

wherein R and R[1] may be the same or different and represent H or CH₃, n and m may be the same or different and 0, 1, 2, 3 or 4, with n+m being 4 maximum, and wherein A represents a hydrocarbon group having 1–6 carbon atoms, or else stands for hydric phenols may be mentioned aromatic dihydroxy compounds of such formulae as

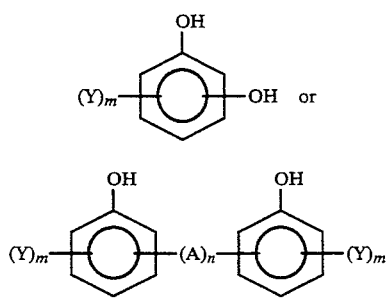

wherein A represents an aliphatic or alicyclic hydrocarbon group having 1–12 carbon atoms,

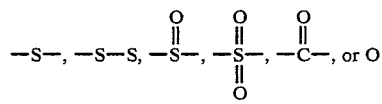

Y stands for halogen, notably bromine or chlorine, R or OR, with R being a hydrocarbon group having 1–10 carbon atoms; and wherein n=0 or i and m=0, 1, 2, 3 or 4. Alternatively, Novolac resins such as phenol/formaldehyde, cresol/formaldehyde or phenol/p-hydroxybenzaldehyde may serve as polyhydric phenol crosslinking agent.

The invention will be further illustrated with reference to the following nonlimiting examples.
Further explanation:

Epoxy resin A is a polyglycidyl ether of a phenol-hydroxy-benzaldehyde condensate having an epoxy equivalent weight (EEW) of 220 and an average epoxy functionality of 3.5.

Epoxy resin B is a phenol-formaldehyde Novolac epoxy resin having an average epoxy functionality of 3.5 and an EEW of 178.

Epoxy resin C is a Bisphenol A bisepoxide resin having an EEW of 174.

Epoxy resin D is a 3,4-epoxycyclohexylmethyl-3,4-epoxycyclohexane carboxylate having an EEW of 137.
Determination of properties The glass transition temperature (Tg) was determined with a Differential Scanning Calorimeter (DSC) manufactured by Dupont, basic module 990 with DSC module 910 at a heating rate of 10° C./min in an atmosphere of nitrogen.

The coefficient of thermal expansion (TEC) in the z-direction and also Tg were determined using a Dupont Thermal Mechanical Analyzer (TMA), basic module 990 with TMA module 942 at 100 ml/min in an atmosphere of nitrogen. Values were determined both during heating (5° C./min) and cooling (2° C./rain).

The decomposition behavior of neat resins was studied with a Dupont Thermo-Gravimetric Analyzer (TGA), basic module 990 with TGA module 951 at a heating rate of 10° C./min in an atmosphere of nitrogen. The study of laminates was conducted in air.

Cured resins were tested for fire retardancy by means of a manual test in which the sample to be tested was held in a flame for 30 seconds. The sample was considered to be fire retardant, if it stopped burning immediately upon being removed from the flame.

Laminates were tested for fire retardancy in accordance with the UL-94 test, which is known to the skilled man.

EXAMPLE 0

Preparation of TAC prepolymer (used in Examples 1, 8, 9, 11, 12 and 13)

To 1 kg of molten TAC monomer in a reactor (fitted with a cooling apparatus and a stirrer) were added 223 g of MEK. Next, the contents of the reactor were heated to 82° C., with stirring, and over a period of 1 hour there was added dropwise a solution of 4.4 g of di(ortho-methylbenzoyl)peroxide in 100 g of MEK phlegmatized with 1.2 g of water.

After a total reaction period of 8 hours at 82° C. the 75% solution of TAC prepolymer in MEK was cooled down to room temperature. Next, MEK was stripped off under reduced pressure. The result was a TAC prepolymer containing less than 2% of MEK residue with a (Brookfield) viscosity of 1250 mPa.s at 23° C., a monomer conversion (mc) of 37%, a number average molecular weight (Mn) of 8000, and a degree of dispersion (D) of 13 (by HPLC relative to Styrene standards).

EXAMPLE 1

66.7 g of a solution prepared from 52.76 g (0.194 equivalents) of tetrabromo Bisphenol-A (TBBPA), 47.24 g of epoxy resin A (0.215 equivalents), and 33.3 g of MEK were mixed, with stirring, with 50 g of TAC prepolymer (mc 37% Mn 8000, D 13, viscosity 1250 mPa.s). The part by weight of TAC prepolymer thus was equal to that of epoxy resin A plus TBBPA.

To the mixture, which contained 12.5 wt. % of methylethyl ketone (MEK),was added 0.5 g of a 10 wt. % solution of 2-ethyl-4-methyl imidazole (2E4MI) in MEK and, subsequently, 0.5 g of tert. butylperoxy perbenzoate. The resin solution was then poured into aluminum dishes in such a way as to give a layer thickness for the resin solution of about 1 mm.

Next, the samples were heated to 60° C. in a forced-circulation air oven and kept at this temperature for 1 hour. The temperature of the oven was then raised to and kept for 30 minutes at 100° C, followed by 3 hours at 150° C and, finally, 30 minutes at 180° C. After the orangish-brown, homogeneously transparent plates had been cooled slowly and released from the mould, the samples were post-cured for a further 2 hours at 200° C. and then cooled to room temperature. The following properties were measured on the flat, cured plates of a thickness of about 1 mm:

| Tg (°C.) | |
|---|---|
| by DSC (mid point) | 186 |
| TMA | 191 |
| TECz (ppm/°C.) | |
| <Tg | 48 |
| >Tg | 198 |
| average (over 20°–250° C.) | 102 |
| TGA (in an atmosphere of nitrogen) | |
| loss at 300° C. (%) | 2.0 |
| decomposition maxima (°C.) | 325 and 394 |
| residue at 650° C. (%) | 24 |
| Manual flame test, fire retardant? | yes |

EXAMPLE 2

The prepreg and laminates were prepared on the basis of a resin solution consisting of:
921 g of a 76%-solution of 330.68 g of epoxy resin A and 369.32 g of TBBPA in MEK;

933 g of a 75%-solution of TAC prepolymer (having a monomer conversion of 36%, Mn=9035, D=15.2, prepared with the use of benzoyl peroxide as initiator) in MEK;

4.7 g of a 15%-solution of 2-ethyl-4-methyl imidazole in acetone;

7.0 g of t-butylperoxy benzoate; and 50 g of acetone.

The resin solution in which the TAC prepolymer part by weight was equal to that of epoxy A plus TBBPA had a viscosity of 50 mPa.s determined in accordance with the instructions by Brookfield at 23° C.

The E-glass fabric type 7628 (finishing agent Z6040) much used in the electronics industry was manually impregnated with the resin solution. Next, the impregnated fabrics were kept at a temperature of 160° C. in a forced-circulation air oven for 286 seconds, resulting in tack-free prepregs of excellent appearance being obtained in the B stage. The percentage by volume of resin in the prepreg was 65%.

Eight prepregs stacked one on top of the other were molded in an autoclave at a pressure of 15 atm. and a temperature of, successively, 150° C. for 30 minutes, 180° C. for 30 minutes, and, finally, 200° C. for 30 minutes. Heating and cooling was at a rate of 3.5° C./min. In this manner both a laminate coated on one side with copper (1 ounce, electrodeposited type) and an uncoated laminate of an overall thickness of 1.60 mm were made.

The properties of the laminate and two reference laminates are given in Table 1. Reference laminate 1 is a purchased standard FR4 laminate that is used on a very wide scale in the printed board industry and contains, in addition to E-glass fabric, a resin made up of brominated Bisphenol A bisepoxy, with dicyanodiamide as curing agent.

The preparation of reference material 2 was analogous to that of the laminate described in Example 2, except that the 65%-solution of resin in MEK contained 490 g (2.227 equivalents) of epoxy A, 544 g (2.000 equivalents) of TBBPA, and 0.72 g of 2-methyl imidazole. Prepregs of this type of resin were prepared in an oven at 175° C. for 60 seconds and molded to form a laminate over a period of 60 minutes at a pressure of 15 atm. and a temperature of 175° C.

The properties of the two reference laminates, each 1.6 mm thick, are given in Table 1.

Besides the aforementioned techniques the following methods/processes were employed to determine a number of additional properties.

Tg was determined with a type MK1 dynamic, mechanical, thermal analysis (DMTA) apparatus of Polymer Laboratories at 10 Hz under an atmosphere of nitrogen and at a heating rate of 5° C./min.

The water absorption was determined in accordance with I.P.C. (Institute for Interconnecting and Packaging Electronic Circuits) TM 650 method 2.6.2.1.

The dichloromethane absorption was determined in conformity with I.P.C. TM 650 method 2.3.4.3., i.e. over a period of 30'. A second measurement was carried out after 1 week.

The dielectric constant and the dissipation factor were measured at 1 MHz on samples which, after having been dried for 30'at 50° C. and cooled in a dessicator, were stored for at least 40 hours at 23° C. in an atmosphere of 50% relative humidity.

The copper peel strength was measured at 23° C. at an angle of 90° C. on a laminate sample of 14×2 on which there was a strip of copper of 3 mm wide. The measuring process was effected by removing excess copper from a copper laminate in a known manner by etching. The peel strength was also measured on samples of which the copper side had been place on hot solder for 10"(Solder float test).

TABLE 1

|  | Example 2 | Ref. 1 (FR-4) | Ref. 2 |
|---|---|---|---|
| Tg (°C.) |  |  |  |
| by DSC (center) | [185][a] | 120 | [180][a] |
| DMTA (damping maximum) | 180 [190][a] | 125 | 170 [180][a] |
| TMA | 165 [170][a] | 115 | 160 [165][a] |
| TECz (ppm/°C.) |  |  |  |
| <Tg | 25 | 36 | 30 |
| >Tg | 225 | 236 | 251 |
| average (over 20°–250° C.) | 110 | 154 | 123 |
| TGA (in air) |  |  |  |
| loss at 300° C. (%) | 1.6 | 1.2 | 1.0 |
| decomposition maximum (°C.) | 325 | 320 | 335 |
| residual glass (= wt. % glass) (%) | 63 | 65 | 62 |
| Dielectric constant ($\epsilon_r$) at 1 MHz | 4.2 | 4.9 | 4.7 |
| Dissipation factor (tan $\delta$) at 1 MHz | 0.007 | 0.03 | 0.012 |
| Water absorption (%) | 0.1 | 0.1 | 0.1 |
| Dichloromethane absorption |  |  |  |
| after 30' | <0.1 | 0.6 | 1.80 [0.20][a] |
| after 1 week | 1.4 [0.4][a] | 21.9* | 23 [8][a] |
| Fire retardancy UL 94, class | VO | VO | VO |
| Bromine content in laminate (%) | 5.7 | 7.4 | 11.7 |
| Copper peel strength (N/cm) |  |  |  |
| as such | 14 | 14 | 16 |
| after solder bath 10" (260'C) | 14[b] | n.b. | n.b. |
| after solder bath 10" (288° C.) | 12[b] | n.b. | n.b |

[a] values in brackets were measured on samples subjected to an additional post-curing treatment in an oven at 200° C. for 2 hours.
[b] there was no blistering and/or delamination.
(c) there was delamination.

EXAMPLE 3 through 9

Analogous to the description in Example 1 resins of the composition indicated in Table 2 were prepared in Examples 3 through 9. The properties of the resulting cured resins are to be found in the same table.

EXAMPLE 10

Analogous to the Examples 1 and 3 through 9, except that a portion of the allyl compound was replaced with 2,2-bis(4-methacryloxy-ethoxyphenyl)propane (BMEPP). The composition of the resin formulation and the properties measured on the cured resin are listed below.

| | |
|---|---|
| TAC monomer | 16 g |
| BMEPP | 24 g |
| Epoxy resin A | 28.34 g (0.130 equiv.) |
| TBBPA | 31.66 g (0.116 equiv.) |
| fraction by weight TAC plus BMEPP calculated on overall weight | 0.40 |
| 10% of 2MI in 2-methoxyisopropanol | 3.0 g |
| t-butylperoxy perbenzoate | 1.2 g |
| MEK | 20.4 g |
| calculated bromine % | 18.6 |
| Results: | |
| Tg (°C.) by TMA | 150 |
| TEC$_z$ (ppm/°C.) | 30 |

-continued

| TGA | |
|---|---|
| loss at 300° C. (%) | 2 |
| decomposition maximum (°C.) | 320 |
| residual at 650° C. (%) | 25 |
| flame test, fire retardant? | yes |

EXAMPLE 11 and 12

In Examples 11 and 12 two non-flame retardant interpenetrating network resin compositions were prepared analogous to Example 1.

In Example 11 hexahydrophthalic anhydride (HHPA) was employed as curing agent for the epoxy and in Example 12 Bisphenol A (BPA).

The composition and properties are compiled in Table 3.

EXAMPLE 13

Analogous to Example 1 an interpenetrating network resin composition was prepared of which composition and properties are outlined below:

| Composition: | |
|---|---|
| TAC prepolymer (g) | 50 |
| Epoxy resin D g/equivalent | 17/0.124 |
| TBBPA g/equivalent | 33/0.121 |
| fraction by weight of TAC prepreg calculated on overall weight | 0.50 |
| 10% of 2E4MI in MEK (g) | 0.5 |
| t-butylperoxy perbenzoate (g) | 0.5 |
| MEK (g) | 20 |
| calculated bromine content (%) | 19.4 |
| Results: | |
| Tg (°C.) by DSC (mid-point) | 135 Tg (°C.) |
| by TMA | 144 |

TABLE 2

| Resin composition and properties of the cured resin | Example 3 | Example 4 | Example 5 | Example 6 | Example 7 | Example 8 | Example 9 |
|---|---|---|---|---|---|---|---|
| Allyl compound type/g | TACmon./70 | TACmon./40 | TACmon./25 TAICmon./25 | TACprep$^a$/50 | DAPmon$^c$/40 | TACprep./50 | TACprep./50 |
| Epoxy type/g/equivalent | A/14.17/0.065 | A/28.34/0.130 | A/23.62/0.108 | A/23.62/0.108 | A/28.34/0.130 | B/20/0.112 | C/20/0.115 |
| TBBPA g/equivalent | 15.83/0.058 | 31.66/0.116 | 26.38/0.097 | 26.38/0.097 | 31.66/0.116 | 30/0.110 | 30/0.110 |
| Fraction by weight of allyl calculated on overall$^b$ | 0.70 | 0.40 | 0.50 | 0.50 | 0.40 | 0.50 | 0.50 |
| 10% of 2E4MI in MEK (g) | 1.5 | — | 1.0 | 1.5 | — | 1.0 | 1.0 |
| 10% of 2E4MI in 2-methoxy-isoprop. (g) | — | 3.6 | — | — | 3.0 | — | — |
| t-butylperoxy perbenzoate (g) | 2.1 | 1.2 | 1.5 | 0.5 | 1.2 | 0.5 | 0.5 |
| MEK (g) | 10 | 20.4 | 16.7 | 16.7 | 20.4 | 16.7 | 16.7 |
| calculated Br. % | 9.3 | 18.6 | 15.5 | 15.5 | 18.6 | 17.6 | 17.6 |
| Tg (TMA), °C. | 191 | 150 | 151 | 135 | 120 | 175 | 178 |
| TEC$_z$ < Tg, ppm/°C. | 50 | 30 | 25 | 46 | 30 | 68 | 30 |
| TGA | | | | | | | |
| loss at 300° C., % | 1.8 | 2.8 | 3 | 4 | 4 | 2 | 2 |
| decomp. max., °C. | 324 and 389 | 325 and 395 | 323 and 397 | 350 | 350 | 322 and 398 | 330 and 385 |
| residual at 650° C., % | 19 | 25 | 29 | 26 | 27 | 24 | 17 |
| flame test, fire retardant? | yes | yes | yes | yes | yes | yes | yes |

$^a$mc = 14%, Mn = 2990, D = 2.85, visc. = 220 mPa · s
$^b$fraction by weight of allyl compound calculated on overall amount of allyl, epoxy, and curing agent
$^c$DAP mon = orthodiallyl phthalate monomer

TABLE 3

| | Example 11 | Example 12 |
|---|---|---|
| TAC prepolymer (g) | 50 | 50 |
| Epoxy resin B g/equivalent | 27/0.152 | 31/0.174 |
| HHPA g/equivalent | 23/0.149 | — |
| BPA g/equivalent | — | 19/0.167 |
| fraction by weight of TAC prepreg calculated on overall weight | 0.50 | 0.50 |
| 10% of 2MI in 2-methoxyisopropanol (g) | 1.0 | — |
| 10% of 2E4MZ in MEK (g) | — | 2.5 |
| t-butylperoxy perbenzoate (g) | 0.5 | 0.5 |
| MEK (g) | 10 | 16.7 |
| dimethyl formamide (g) | 7 | — |
| Results: | | |
| Tg (°C.) by TMA | 120 | 168 |
| T.C.E.$_z$ < Tg (ppm/°C.) | 80 | 55 |
| TGA | | |
| loss at 300° C. (%) | 2.0 | 2.0 |
| decomp. max. (°C.) | 430 | 430 |
| residual at 650° C. | 8 | 17 |
| T.C.E.$_z$ < Tg (ppm/°C.) | | 40 |
| TGA | | |
| loss at 300° C. (%) | | 3.0 |
| decomp. max. (°C.) | | 308; 370 |
| residual at 650° C. | | 12 |
| flame test, fire retardant? | | yes |

We claim:

1. A laminate comprising a layer of metal and a polymeric material comprising an interpenetrating polymer network composed of a first component consisting essentially of a cyclic moiety-containing polyallyl compound, optionally in combination with an aromatic difunctional methacrylate, polymerized and crosslinked in the presence of a free radical initiator and a second component consisting essentially of an epoxy resin cross-linked with a polyhydric phenol.

2. The laminate of claim 1 wherein said first component of the interpenetrating polymer network consists of a cyclic moiety-containing polyallyl compound and an aromatic difunctional methacrylate.

3. The laminate of claim 1 wherein said polymeric material is reinforced with fiber.

4. The laminate of claim 2 wherein said polymeric material is reinforced with fiber.

5. The laminate of claim 1 wherein the weight ratio of said polyallyl compound to said epoxy resin is in the range of from about 30/70 to about 40/60.

6. The laminate of claim 3 wherein the weight ratio of said polyallyl compound to said epoxy resin is in the range of from about 30/70 to about 40/60.

7. The laminate of claim 1 wherein the cyclic moiety-containing polyallyl compound is triallyl cyanurate or a prepolymer of triallyl cyanurate.

8. The laminate of claim 1 wherein the epoxy resin is a phenol-based epoxy resin.

9. The laminate of claim 1 wherein the cross-linking agent for the epoxy resin is Bisphenol-A or tetrabromo Bisphenol-A.

10. The laminate of claim 1 wherein said initiator is a peroxide.

11. A laminate comprising a fiber-reinforced polymeric material comprising an interpenetrating polymer network composed of a first component consisting essentially of a cyclic moiety-containing polyallyl compound, optionally in combination with an aromatic difunctional methacrylate, polymerized and cross-linked in the presence of a free radical initiator and a second component consisting essentially of an epoxy resin cross-linked with a polyhydric phenol.

12. The laminate of claim 11 wherein said first component of the interpenetrating polymer network consists of a cylic moiety-containing polyallyl compound and an aromatic difunctional methacrylate.

13. A laminate comprising a layer of metal and a polymeric material consisting essentially of an interpenetrating polymer network composed of:
   (a) a cyclic moiety-containing polyallyl compound polymerized and cross-linked in the presence of a free radical initiator, and
   (b) an epoxy resin cross-linked with a polyhydric phenol, wherein the weight ratio of said polyallyl compound to said epoxy resin is in the range of from about 30/70 to about 40/60.

* * * * *